(12) United States Patent
Yadav et al.

(10) Patent No.: US 8,320,209 B2
(45) Date of Patent: Nov. 27, 2012

(54) SENSE AMPLIFIER USING REFERENCE SIGNAL THROUGH STANDARD MOS AND DRAM CAPACITOR

(75) Inventors: Sanjay Kumar Yadav, Greater Noida (IN); G Penaka Phani, Greater Noida (IN); Shallendra Sharad, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 265 days.

(21) Appl. No.: 12/857,172

(22) Filed: Aug. 16, 2010

(65) Prior Publication Data

US 2011/0273922 A1    Nov. 10, 2011

(30) Foreign Application Priority Data

May 5, 2010    (IN) .......................... 1062/DEL/2010

(51) Int. Cl.
    *G11C 7/02*    (2006.01)
(52) U.S. Cl. ...................... 365/210.1; 365/149; 365/154; 365/203; 365/207; 365/210.14; 365/210.15
(58) Field of Classification Search ............... 365/210.1, 365/210.14, 210.15, 149, 154, 203, 207
    See application file for complete search history.

(56) References Cited

U.S. PATENT DOCUMENTS

| | | | | |
|---|---|---|---|---|
| 5,726,931 A | * | 3/1998 | Zagar et al. ................... | 365/149 |
| 5,880,988 A | * | 3/1999 | Bertin et al. .................... | 365/63 |
| 5,912,853 A | * | 6/1999 | Rao ............................... | 365/205 |
| 6,097,649 A | * | 8/2000 | Chiang et al. ................. | 365/203 |
| 6,351,422 B2 | * | 2/2002 | Rohr et al. ..................... | 365/203 |
| 6,501,675 B2 | * | 12/2002 | Pilo et al. ....................... | 365/149 |
| 6,862,233 B2 | * | 3/2005 | Laurent ......................... | 365/201 |
| 6,914,840 B2 | | 7/2005 | Agata | |
| 7,046,565 B1 | * | 5/2006 | Barth et al. .................... | 365/203 |
| 7,307,866 B2 | * | 12/2007 | Yamaoka et al. ............. | 365/145 |
| 7,330,388 B1 | | 2/2008 | Chapman et al. | |
| 7,477,559 B2 | * | 1/2009 | Taddeo .......................... | 365/205 |
| 7,590,017 B2 | * | 9/2009 | Romanovskyy et al. ..... | 365/203 |
| 7,881,119 B2 | * | 2/2011 | Fukushima ............. | 365/185.21 |
| 8,125,844 B2 | * | 2/2012 | Kang et al. .................... | 365/203 |
| 2009/0268510 A1 | | 10/2009 | Barth, Jr. et al. | |

* cited by examiner

*Primary Examiner* — Viet Q Nguyen
(74) *Attorney, Agent, or Firm* — Hogan Lovells US LLP

(57) ABSTRACT

A memory circuit includes a first memory cell node capacitor, a first memory cell node transistor, a second memory cell node having a second memory cell node capacitor and a second memory cell node transistor, and a pre-charging circuit for pre-charging the first and second memory cell nodes to first and second voltage levels, respectively. The circuit includes a reference memory cell having first and second reference cell transistors with an equalizing transistor between, and a sense amplifier that detects a potential difference between reference bit lines from the reference memory cell and the first or second memory cell node, respectively. The reference cell transistors and equalizing transistor perform a first voltage equalization of the memory cell nodes at a predetermined voltage and a second voltage equalization of the memory cell nodes based on first or second reference signals respectively input to the first or second reference cell transistor.

8 Claims, 4 Drawing Sheets

SENSE AMPLIFIER USING REFERENCE SIGNAL THROUGH STANDARD MOS AND DRAM CAPACITOR

RELATED APPLICATION

The present application claims priority of India Patent Application No. 1062/DEL/2010 filed May 6, 2010, which is incorporated herein in its entirety by this reference.

FIELD OF THE INVENTION

The present invention relates to a memory circuit, specifically a dynamic random access memory DRAM circuit, as well as a method of sense amplifying in such a memory circuit.

BACKGROUND

Ground sensing or VDD sensing schemes of DRAM circuits provide many advantages in improving memory performance. However, such sensing schemes require a unique reference cell for providing a reference voltage for sensing. A conventional reference cell in a DRAM circuit generally comprises two access transistors and a single capacitor. In order to differentiate reference cell data from the memory cell data and provide a reference voltage, the reference cell requires a particular power supply voltage. It is difficult to obtain a stable, high current power supply voltage for the reference cell capacitor. Consequently, using such a power supply voltage as a sensing reference creates a lot of noise and degrades the sensing operation and memory performance. In the following, a memory circuit according to the art will be described.

FIG. 1 shows a memory device as disclosed in U.S. Pat. No. 6,914,840. The DRAM circuit comprises a memory cell having a memory cell capacitor and a reference cell having a reference cell capacitor. Referring to FIG. 1, the NMOS-type DRAM circuit 10 includes a memory cell 11, a CMOS sense amplifier 12, a precharge circuit 13, and a dummy cell 14. The memory cell 11 is at the intersection of a word line WL and a bit line BL. The CMOS sense amplifier 12 serves to sense and amplify a potential difference between the pair of bit lines BL and BLX. The precharge circuit 13 precharges the bit line pair BL and BLX. The dummy cell 14 is provided at the intersection of a dummy word line DWL and the bit line BLX. The memory cell 11 is a 1-transistor cell composed of an NMOS transistor 111 and a main capacitor 112. The NMOS transistor 111 is turned on by activating the word line WL while the bit line BL is inactive, thereby electrically coupling the main capacitor 112 to the bit line BL.

The sense amplifier 12, which is activated by activation of a signal line SAP, detects a potential difference caused between the bit line pair BL and BLX, and puts one of the bit line pair BL and BLX to a power supply voltage VDD (the activation voltage of the signal line SAP), while putting the other to a GND level. The precharge circuit 13, which is activated by activating a signal line PRE when the word line WL and the dummy word line DWL are inactive, precharges the bit line pair BL and BLX to the GND level. The dummy cell 14 is composed of NMOS transistors 141 and 142 and a dummy capacitor 143. The NMOS transistor 141 is turned on by activation of the dummy word line DWL, whereby the dummy capacitor 143 is electrically coupled with the bit line BLX. The NMOS transistor 142 is turned on by activating the precharge-signal-supplying signal line PRE when the dummy word line DWL is inactive, thereby electrically coupling the dummy capacitor 143 and a voltage line VPRE with each other. The voltage line VPRE supplies the power supply voltage VDD.

Another problem arising in the conventional memory devices according to the art is that they require reference rows and constraints on the charge pump. Further, they require a power supply voltage of VDD/2 to pre-charge the reference store capacitor in the conventional sense amplifier. Uncontrolled variations in the reference signal may also arise. Some conventional memory devices according to the art implement a sense amplifier using a large number of dummy rows, which represent an overhead in the silicon area necessary to provide the memory circuit. A high complexity is often associated with the generation of reference rows and reference pre-charging signals and constraints exist on the charge pump to support the high voltage that drives the dummy rows. An extra power supply of VDD/2 is necessary to pre-charge the reference store capacitor of the dummy rows.

There is therefore a need for an improved memory circuit overcoming the above mentioned disadvantages of the memory circuits according to the art.

SUMMARY

In view of the foregoing, disclosed herein are embodiments of a memory circuit that incorporates a first memory cell node comprising a first memory cell node capacitor electrically coupled to a ground and a first memory cell node transistor, a second memory cell node comprising a second memory cell node capacitor electrically coupled to a ground and a second memory cell node transistor, a pre-charging circuit that pre-charges said first memory cell node to a first voltage level and said second memory cell node to a second voltage level, respectively, a reference memory cell comprising a first reference cell transistor, a second reference cell transistor, and an equalizing transistor that is arranged between said first reference cell transistor and said second reference cell transistor, and a sense amplifier that detects a potential difference between a reference bit line from said reference memory cell and a bit line from said first or second memory cell node during a read operation of the memory circuit, wherein said first reference cell transistor, said second reference cell transistor and said equalizing transistor perform a first voltage equalization of said first memory cell node and said second memory cell node at a predetermined voltage and a second voltage equalization of said first memory cell node and said second memory cell node based on one of a first reference signal and a second reference signal that are respectively input to said first reference cell transistor and said second reference cell transistor.

Also disclosed herein are embodiments of a method of sense amplifying in a memory circuit.

According to an embodiment of the invention, the first memory cell node transistor electrically couples the first memory cell node capacitor to a first bit line when a first word line is active, and the second memory cell node transistor electrically couples the second memory cell node capacitor to a second bit line when a second word line is active.

According to a further embodiment of the invention, the first voltage equalization of the first memory cell node and second memory node at a predetermined voltage is performed when the equalization transistor is turned on.

According to yet another embodiment of the invention, the predetermined voltage is essentially half of the first voltage level.

According to another embodiment of the invention, a voltage level on the obtained reference bit line is essentially half of the corresponding signal on the true bit line.

According to yet another embodiment of the invention, the sense amplifier comprises a logic gate arrangement and a transistor to which a signal is input.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
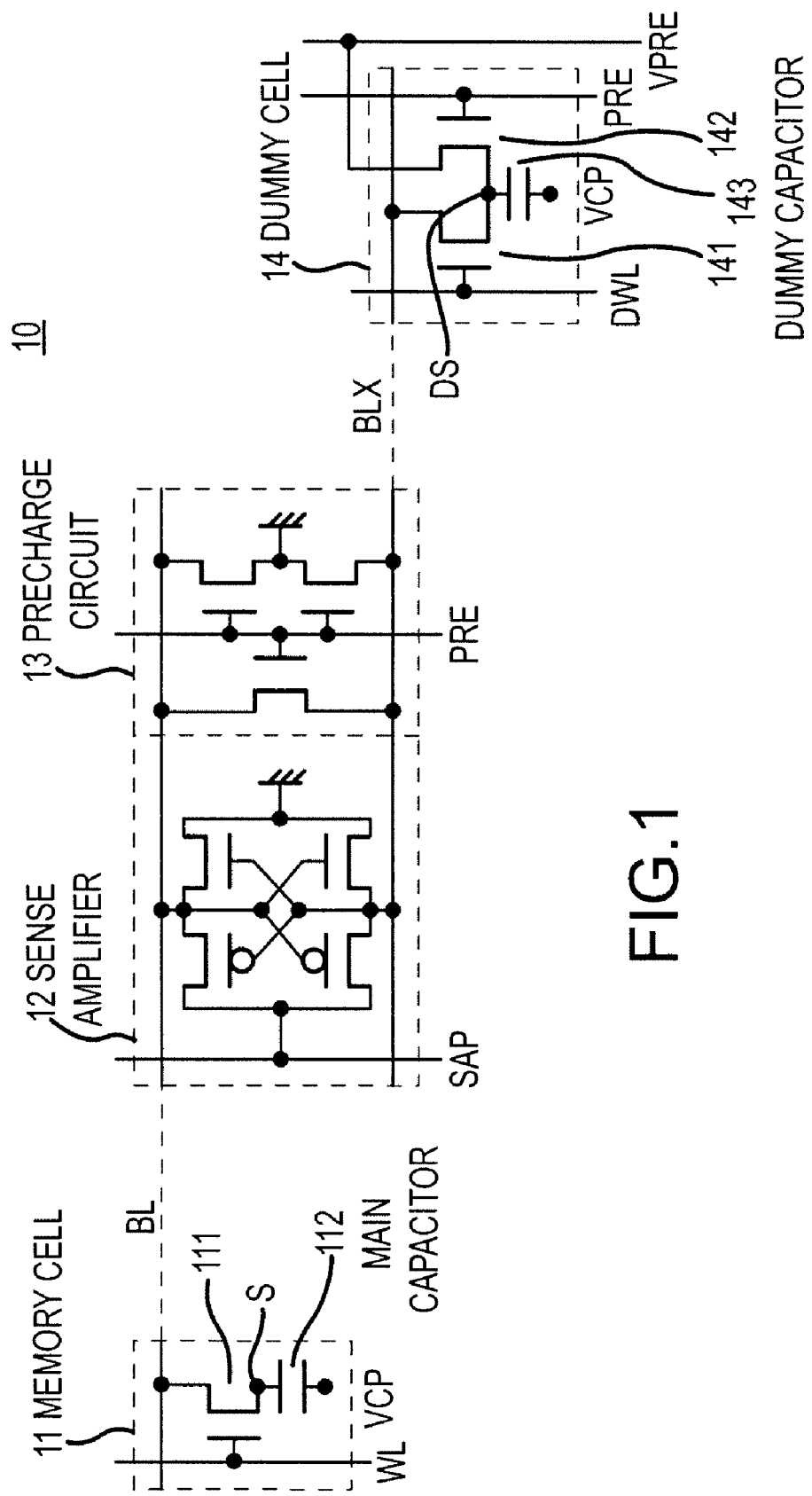
FIG. 1 is a schematic diagram illustrating a prior art DRAM circuit.

Embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 2:
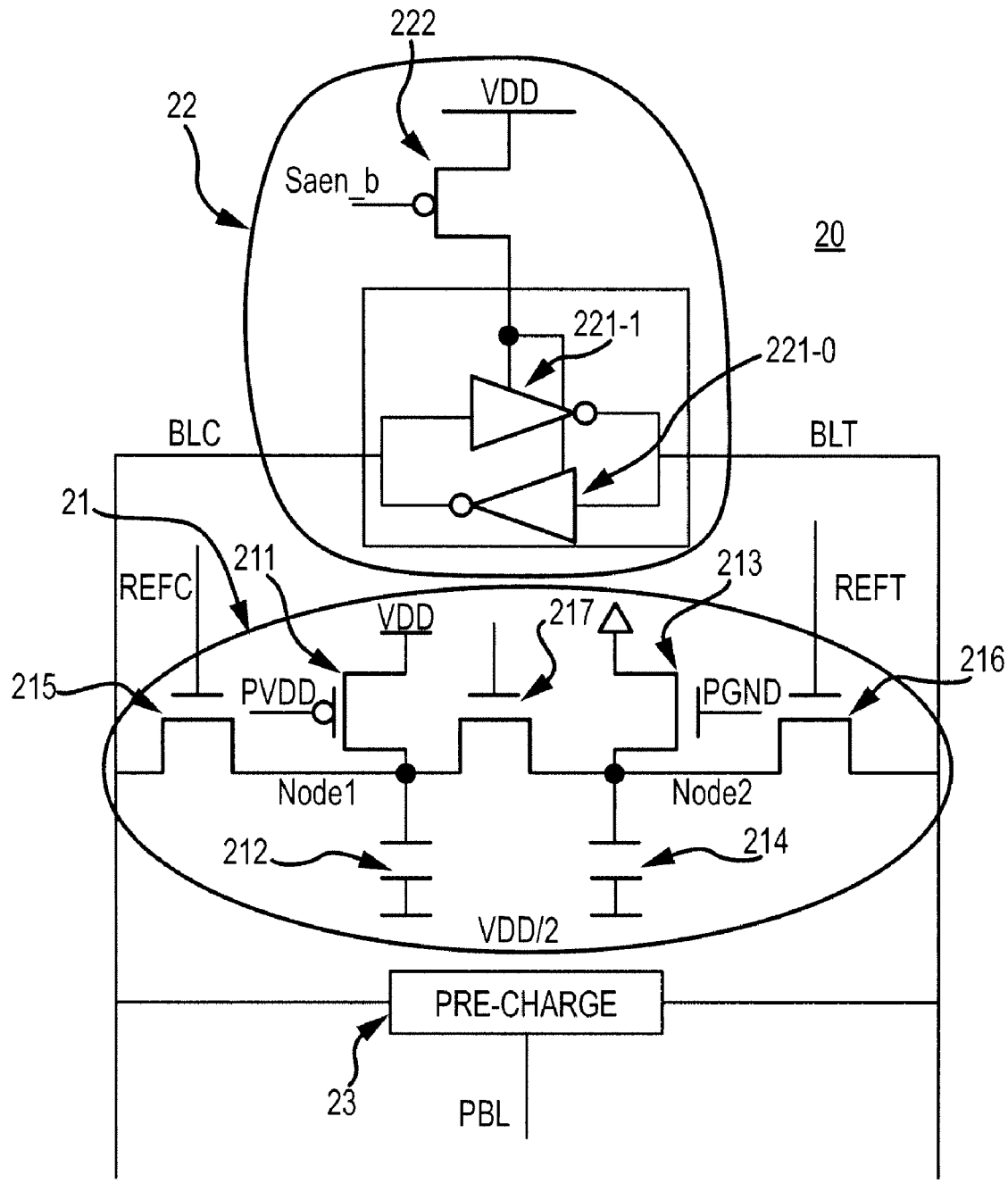
FIG. 2 is a schematic diagram illustrating a memory circuit according to an embodiment of the present invention.

A memory circuit 20 according to an embodiment of the present invention is represented in FIG. 2. The memory circuit 20 comprises a first memory cell node comprising a first memory cell node capacitor 212 electrically coupled to VDD/2 and a first memory cell node transistor 211. The memory circuit 20 further comprises a second memory cell node comprising a second memory cell node capacitor 214 electrically coupled to VDD/2 and a second memory cell node transistor 213. The memory circuit 20 further comprises a pre-charging circuit 23 that pre-charges the first memory cell node to a first voltage level VDD and the second memory cell node to a second voltage level VGND, respectively.

As apparent from FIG. 2, the memory circuit 20 according to an embodiment of the present invention further comprises a reference memory cell 21 comprising a first reference cell transistor 215, a second reference cell transistor 216, and an equalizing transistor 217. The equalizing transistor 217 is arranged between the first reference cell transistor 215 and the second reference cell transistor 216. The first reference cell transistor 215, second reference cell transistor 216 and equalizing transistor 217 are arranged with respect to each other such that they can perform a first voltage equalization of the first memory cell node and the second memory cell node at a predetermined voltage VDD/2. Further, the first reference cell transistor 215, second reference cell transistor 216 and equalizing transistor 217 are capable of performing a second voltage equalization of the first memory cell node and second memory cell node based on one of a first reference signal and a second reference signal that are respectively input to the first reference cell transistor 215 and the second reference cell transistor 216.

Moreover, the memory circuit 20 according to an embodiment of the present invention comprises a sense amplifier 22 that detects a potential difference between a reference bit line from the reference memory cell 21 and a bit line from the first or second memory cell node during a read operation of the memory circuit. The sense amplifier 22 comprises a logic gate arrangement 221-0, 221-1 and a transistor 222 to which a signal is input.

In the memory circuit 20 according to an embodiment of the invention, the first memory cell node transistor 211 electrically couples the first memory cell node capacitor 212 to a first bit line when a first word line is active, and the second memory cell node transistor 213 electrically couples the second memory cell node capacitor 214 to a second bit line when a second word line is active.

In the following, the working principle of the memory circuit 20 according to an embodiment of the invention will be explained.

A reference signal is generated in a reference bit line using a capacitor of a memory cell. The first memory cell node is pre-charged to a first voltage level VDD and the second memory cell node to a second voltage level VGND, respectively, by the pre-charging circuit 23. The voltage levels at the first memory cell node and second memory cell node are then equalized in a first voltage equalizing step at a predetermined voltage VDD/2, when the equalizing transistor 217 of the reference memory cell 21 is turned on. The voltage levels at the first memory cell node and second memory cell node are then equalized again in a second voltage equalizing step with the respective true bit line BLT of the respective memory cell or the complementary bit line BLC of the memory cell based on the respective reference signals REFC and REFT signals that are input to the first reference cell transistor 215 and the second reference cell transistor 216.

After this second voltage equalization step of the first resp. second memory cell node with the first resp. second reference signal REFC or REFT, the reference bit line has a signal thereon that is essentially half of the signal on the true bit line. The signal on the reference bit line and the signal on the true bit line have the following formulas:

$$\text{Signal Reference Bit Line} = 0.5 * VDD * Cmem/(Cbl + Cmem)$$

$$\text{Signal True Bit Line} = VDD * Cmem/(Cbl + Cmem)$$

Figure 3:
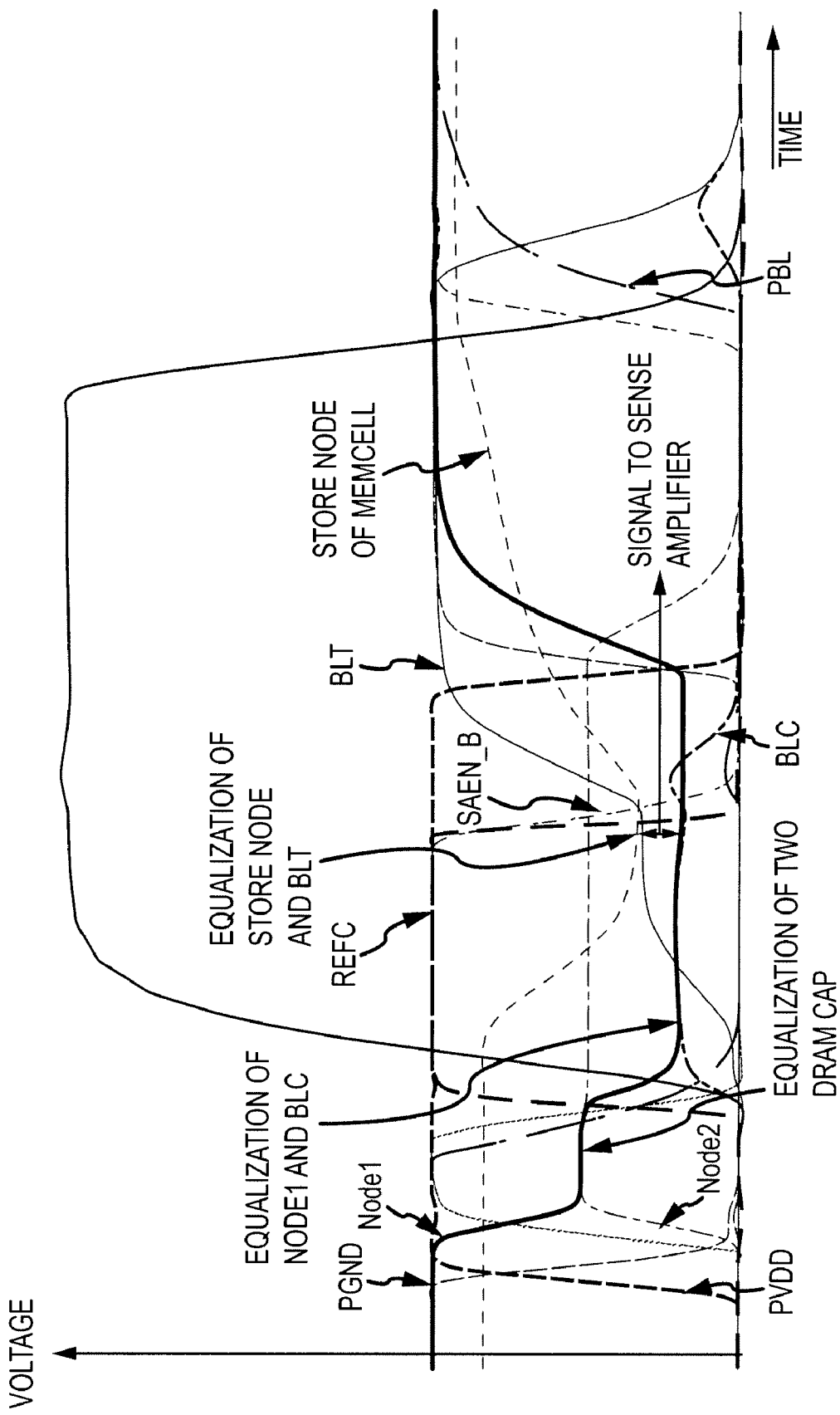
FIG. 3 is a diagram representing the voltage levels of different signals in the case of refresh of 1 as a function of time.
Figure 4:
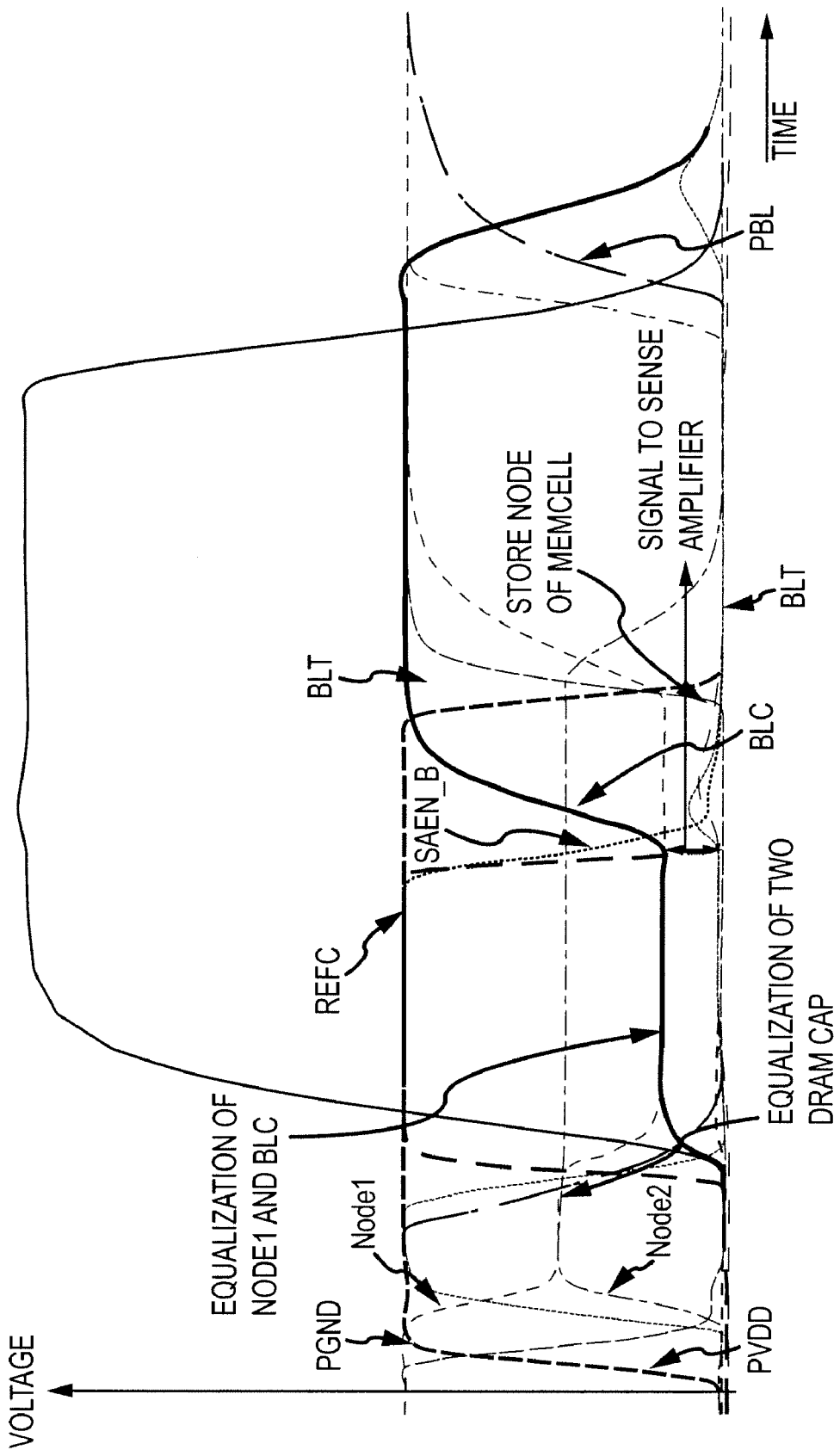
FIG. 4 is a diagram representing the voltage levels of different signals in the case of refresh of 0 as a function of time.

FIG. 3 shows a representation of the voltage levels of different signals as a function of time, in the case of a refresh of 1. FIG. 4 represents the same signals as a function of time, in the case of refresh of 0. In both figures, it can be seen how the voltage levels at the first memory cell node and second memory cell node are equalized to obtain a single voltage level value. After this first voltage equalization step, a second voltage equalization of the first memory cell node and second memory cell node with the reference bit line is performed. In the case of the refresh of 1, shown in FIG. 3, a signal difference is obtained, which is visible in FIG. 3. On the contrary, in the case of the refresh of 0 shown in FIG. 4, after the second voltage equalization, the voltage difference obtained is essentially nil.

As has become apparent from the description above, a memory circuit 20 according to an embodiment of the present invention presents several advantages. The reference signal that is obtained has the property of always tracking the actual signal and the bit line of the capacitor of the memory cell. Further, contrary to the conventional memory devices according to the art, no reference WL bit line is necessary, so that the extra stress on the charge pump is reduced. The memory circuit 20 according to an embodiment of the present invention allows reducing the silicon area overhead, thus allowing to obtain an efficient area design. Finally, no power supply voltage VDD/2 is required to pre-charge the memory cell nodes.

The foregoing description of the specific embodiments will so fully reveal the general nature of the invention that others can, by applying current knowledge, readily modify and/or adapt for various applications of such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, the person skilled in the art will recognize that these embodiments can be practiced with modification within the spirit and scope of the appended claims.

The invention claimed is:

1. A memory circuit comprising:
   a first memory cell node comprising a first memory cell node capacitor electrically coupled to a first memory cell node transistor,
   a second memory cell node comprising a second memory cell node capacitor electrically coupled to a second memory cell node transistor,
   a pre-charging circuit that pre-charges said first memory cell node to a first voltage level and said second memory cell node to a second voltage level, respectively,
   a reference memory cell comprising a first reference cell transistor, a second reference cell transistor, and an equalizing transistor that is arranged between said first reference cell transistor and said second reference cell transistor, and
   a sense amplifier that detects a potential difference between a reference bit line from said reference memory cell and a bit line from said first or second memory cell node during a read operation of the memory circuit,
wherein said first reference cell transistor, said second reference cell transistor and said equalizing transistor perform a first voltage equalization of said first memory cell node and said second memory cell node at a predetermined voltage and a second voltage equalization of said first memory cell node and said second memory cell node based on one of a first reference signal and a second reference signal that are respectively input to said first reference cell transistor and said second reference cell transistor.

2. The memory circuit according to claim 1, wherein said first memory cell node transistor electrically couples said first memory cell node capacitor to a first bit line when a first word line is active, and said second memory cell node transistor electrically couples said second memory cell node capacitor to a second bit line when a second word line is active.

3. The memory circuit according to claim 1, wherein said first voltage equalization of said first memory cell node and said second memory cell node at a predetermined voltage is performed when said equalizing transistor is turned on.

4. The memory circuit according to claim 1, wherein said predetermined voltage is essentially half of said first voltage level.

5. The memory circuit according to claim 1, wherein a voltage level on the obtained reference bit line is essentially half of the corresponding signal on the true bit line.

6. The memory circuit according to claim 1, wherein the sense amplifier comprises a logic gate arrangement and a transistor to which a signal is input.

7. A method of sense amplifying in a memory circuit, wherein said memory circuit comprises a first memory cell node comprising a first memory cell node capacitor electrically coupled to a first memory cell node transistor, and a second memory cell node comprising a second memory cell node capacitor electrically coupled to a second memory cell node transistor, said method comprises:
   pre-charging said first memory cell node to a first voltage level and said second memory cell node to a second voltage level, respectively,
   performing, by an equalizing transistor, a first voltage equalization of said first memory cell node and said second memory cell node at a predetermined voltage and a second voltage equalization of said first memory cell node and said second memory cell node based on one of a first reference signal and a second reference signal that are respectively input to a first reference cell transistor and a second reference cell transistor of a reference memory cell further comprising said equalizing transistor that is arranged between said first reference cell transistor and said second reference cell transistor, and
   detecting, by a sense amplifier, a potential difference between a reference bit line from said reference memory cell and a bit line from said first or second memory cell node during a read operation of the memory circuit.

8. The method according to claim 7, further comprising:
   electrically coupling, by said first memory cell node transistor, said first memory cell node capacitor to a first bit line when a first word line is active, and electrically coupling, by said second memory cell node transistor, said second memory cell node capacitor to a second bit line when a second word line is active.

* * * * *

UNITED STATES PATENT AND TRADEMARK OFFICE
CERTIFICATE OF CORRECTION

PATENT NO. : 8,320,209 B2
APPLICATION NO. : 12/857172
DATED : November 27, 2012
INVENTOR(S) : Sanjay Kumar Yadav et al.

It is certified that error appears in the above-identified patent and that said Letters Patent is hereby corrected as shown below:

Title Page, Item (75)

(75) Inventors: "Shallendra" should be --Shailendra--

Signed and Sealed this
Fifth Day of March, 2013

Teresa Stanek Rea
*Acting Director of the United States Patent and Trademark Office*